United States Patent
Chu et al.

(10) Patent No.: US 11,742,276 B2
(45) Date of Patent: *Aug. 29, 2023

(54) SEMICONDUCTOR PACKAGE AND MANUFACTURING PROCESS THEREOF

(71) Applicant: Taiwan Semiconductor Manufacturing Company, Ltd., Hsinchu (TW)

(72) Inventors: Li-Huan Chu, Hsinchu (TW); Hsu-Hsien Chen, Hsinchu (TW); Liang-Chen Lin, Hsinchu County (TW); Tsung-Yang Hsieh, Taipei (TW); Hsin-Hsien Lee, Hsinchu (TW); Kuen-Hong Tsai, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/725,527

(22) Filed: Apr. 20, 2022

(65) Prior Publication Data
US 2022/0246511 A1    Aug. 4, 2022

Related U.S. Application Data

(63) Continuation of application No. 16/655,239, filed on Oct. 17, 2019, now Pat. No. 11,315,860.

(51) Int. Cl.
*H01L 23/498*   (2006.01)
*H01L 23/538*   (2006.01)
(Continued)

(52) U.S. Cl.
CPC .. *H01L 23/49827* (2013.01); *H01L 21/02433* (2013.01); *H01L 21/561* (2013.01); *H01L 21/565* (2013.01); *H01L 21/76* (2013.01); *H01L 21/768* (2013.01); *H01L 23/49866* (2013.01); *H01L 23/538* (2013.01); *H01L 23/5385* (2013.01); *H01L 23/5386* (2013.01); *H01L 24/81* (2013.01); *H01L 25/0655* (2013.01);
(Continued)

(58) Field of Classification Search
CPC ..... H01L 21/561; H01L 21/565; H01L 21/76; H01L 21/768; H01L 23/49866; H01L 23/562; H01L 23/49827; H01L 24/81; H01L 25/0655; H01L 25/50; H01L 2021/60135; H01L 2224/81815; H01L 21/02433; H01L 29/04–045; H01L 23/538–5389
See application file for complete search history.

(56) References Cited

U.S. PATENT DOCUMENTS 11,315,860 B2 * 4/2022 Chu ................. H01L 24/17

* cited by examiner

*Primary Examiner* — Jose R Diaz
(74) *Attorney, Agent, or Firm* — JCIPRNET (57) ABSTRACT

A package manufacturing process and semiconductor packages are provided. An interposer having a crystal structure is provided. A first die and a second die are bonded on the interposer. The second die is positioned to be spaced apart from the first die with a gap extending direction that is perpendicular to a shortest distance of the gap, and the gap extending direction is not parallel with a crystallographic orientation of the crystal structure of the interposer. A molding compound is formed over the interposer covering the first and second dies. The molding compound and the interposer are cut into packages.

20 Claims, 10 Drawing Sheets (51) Int. Cl.
  *H01L 25/065* (2023.01)
  *H01L 21/76* (2006.01)
  *H01L 29/04* (2006.01)
  *H01L 21/02* (2006.01)
  *H01L 25/00* (2006.01)
  *H01L 21/56* (2006.01)
  *H01L 21/768* (2006.01)
  *H01L 23/00* (2006.01)
  *H01L 21/60* (2006.01)

(52) U.S. Cl.
  CPC ............ *H01L 25/50* (2013.01); *H01L 29/045* (2013.01); *H01L 2021/60135* (2013.01); *H01L 2224/81815* (2013.01); *H01L 2225/06555* (2013.01); *H01L 2225/06562* (2013.01)

SEMICONDUCTOR PACKAGE AND MANUFACTURING PROCESS THEREOF

CROSS-REFERENCE TO RELATED APPLICATION

This application is a continuation application of and claims the priority benefit of a prior application Ser. No. 16/655,239, filed on Oct. 17, 2019 and now allowed. The entirety of the above-mentioned patent application is hereby incorporated by reference herein and made a part of this specification.

BACKGROUND

In advanced packaging processes, the semiconductor packages may integrate multi-chips onto an interposer containing through vias by chip-to-wafer bonding process and the assemblies may be mounted to the substrate. The improvement in structural strength and integrity of the packages leads to better reliability and high yield.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

For the embodiments provided herein, the technology may be discussed in a specific context, namely, arranging dies or chip in a specific direction relative to the crystallographic direction(s) of the underlying crystalline semiconductor wafer interposer. Through the arrangement and layout design of the dies, the stressed location is not parallel with the crystallographic orientation of the underlying interposer and less or minimal stress is transferred along the crystallographic orientation, so that possible cracking of the underlying crystalline semiconductor wafer interposer owing to the warpage of the package structure during the heating process may be avoided or lessened. This enables a more reliable package structure by reducing the likelihood of interposer cracking. The relative orientations of the dies and the underlying crystalline semiconductor wafer interposer may mitigate or soften the impact caused by warpage from the coefficient of thermal expansion (CTE) mismatch.

Packaging processes may include forming multi-chip package structures using Chip-on-Wafer-on-Substrate (CoWoS) packaging processing. Other embodiments may also include other processing, including wafer-level packaging processing or package-on-package assembly processing. Embodiments discussed herein are to provide examples to enable making or using the subject matter of this disclosure, and a person having ordinary skill in the art will readily understand modifications that can be made while remaining within contemplated scopes of different embodiments. Like reference numbers and characters in the figures below refer to like components. Although method embodiments may be discussed as being performed in a particular order, other method embodiments may be performed in any logical order.

FIG. 1 through FIG. 6 are schematic views of various stages in a manufacturing method of a package structure according to some exemplary embodiments of the disclosure.

Figure 1:
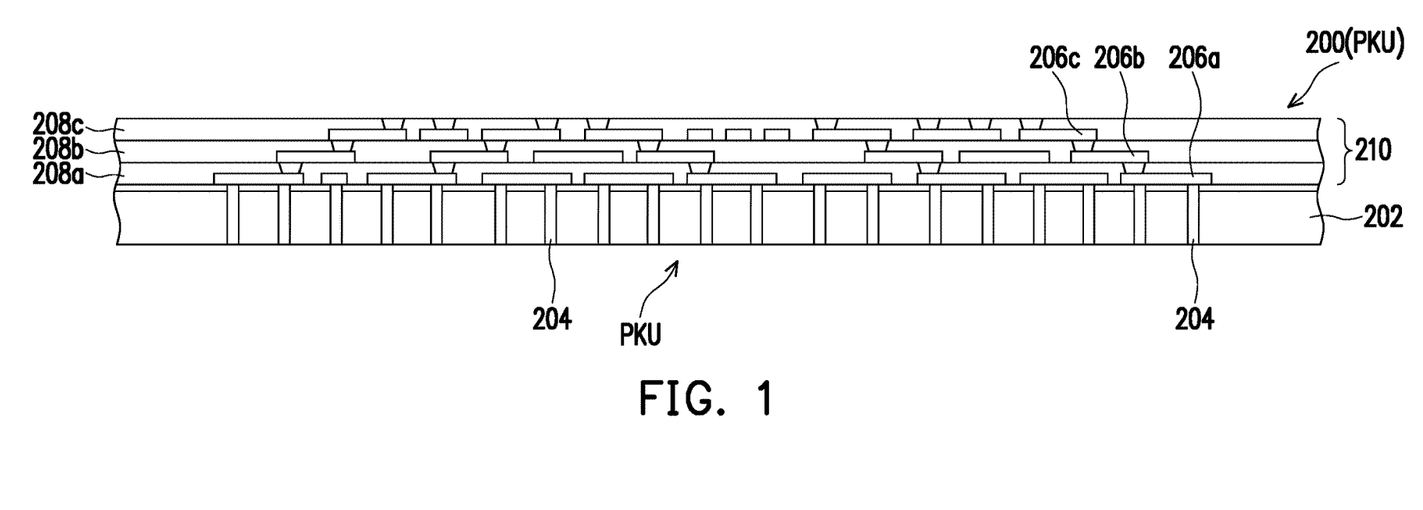
FIG. 1, FIG. 2A and FIG. 3 through FIG. 6 are schematic cross-sectional views of various stages in a manufacturing method of a package structure according to some exemplary embodiments of the disclosure.

In FIG. 1, an interposer 200 is provided. In some embodiments, the interposer 200 includes a semiconductor substrate 202 and through vias 204 therein. In FIG. 1, instead of showing the whole interposer 200, only a portion of the interposer 200 including one or more packaging units PKU is shown, and the number of the through vias in the interposer is not limited to the exemplary example shown in the figure. In some embodiments, a redistribution structure 210 is formed on the substrate 202 and over the through vias 204. In some embodiments, the substrate 202 may comprise a bulk semiconductor material substrate, SOI substrate or a multi-layered semiconductor material substrate. The semiconductor material of the semiconductor substrate 202 may be silicon, germanium, silicon germanium, silicon carbide, gallium arsenic, gallium phosphide, indium phosphide, indium arsenide, indium antimonide, GaAsP, AlInAs, AlGaAs, GaInAs, GaInP, GaInAsP, or combinations thereof. In some embodiments, the substrate 202 may be doped or undoped. In some embodiments, the substrate 202 may be doped with P-type dopants such as boron (B), aluminum (Al), or gallium (Ga) or doped with N-type dopants such as phosphorous (P), arsenic (As), or antimony (Sb). In some embodiments, the interposer 200 includes a bulk semiconductor wafer having a crystal structure. In one embodiment, the interposer 200 may be a bulk silicon wafer having a crystal structure, such as a cubic crystal structure.

In some embodiments, through vias 204 are formed in the substrate 202 and penetrates through the substrate 202. In some embodiments, as shown in FIG. 1, the through vias 204 are through-substrate vias. In some embodiments, the through vias 204 are through-silicon vias when the substrate 202 includes a silicon substrate. In some other embodiments, the through vias 204 may extend into the substrate 202 without penetrating through the substrate 202 and at a later stage, the substrate 202 may be thinned down from the backside to expose the ends of the through vias 204. In FIG. 1, at this stage, the interposer 200 has been thinned and the ends of the through vias 204 are exposed. Although not illustrated in the figure, it is understood that a carrier or a glass carrier may be provided under the interposer 200 for supporting purposes. In some embodiments, the through vias 204 may be formed by forming holes or recesses in the substrate 202 and then filling the recesses with a conductive material. In some embodiments, the recesses may be formed by, for example, etching, milling, laser drilling or the like. In some embodiments, the conductive material may be formed by an electro-chemical plating process, chemical vapor deposition (CVD), atomic layer deposition (ALD) or physical vapor deposition (PVD), and the conductive material may include copper, tungsten, aluminum, silver, gold or a combination thereof.

Wafers are grown from crystal having a regular crystal structure. Crystallographic planes and directions are described by Miller Indices such as (100), (111), (110), etc. In a symmetric crystal lattice, certain directions are equivalent to one another, and groups of equivalent directions or planes are called families. For example, in a cubic crystal system, directions [100], [010], and [001] are in the <100> family. The crystal orientation of the wafer is specified in two ways: the orientation of the plane of the surface of the wafer, and the location of the wafer primary flat (the flat side of the longest length located in the circumference of the wafer). For the commonly used wafers (p- and n-type (100) and (111) wafers), the primary flat is aligned with the direction. Alternatively, for larger size wafers, a notch instead of the primary flat is used to mark the wafer for orientation during fabrication. For example, a (100) silicon wafer may be cut along a {100} plane with a notch pointed to [011] direction to orient the wafer.

Figure 7A:
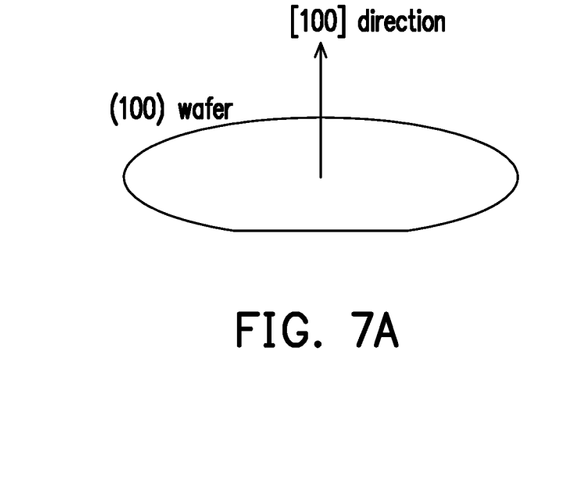
FIG. 7A and FIG. 7B show the crystallographic orientations of a (100) wafer.
Figure 7B:
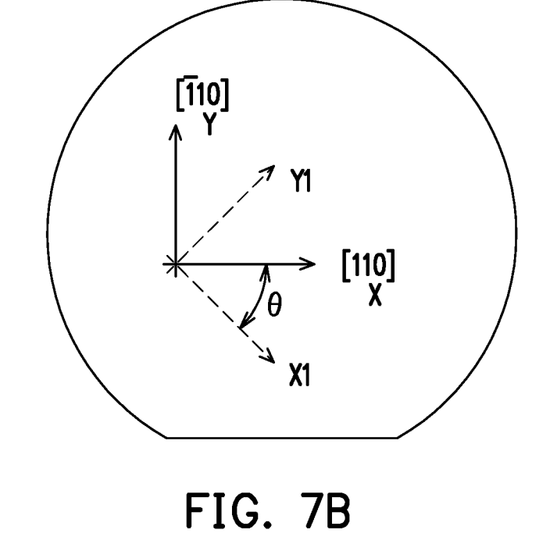

In some embodiments, the bulk silicon wafer is a silicon wafer having a crystal structure and the crystallographic orientation of the surface of the crystalline silicon wafer may be (100) or (111). In one embodiment, the bulk silicon wafer is a (100) wafer having the top surface of the wafer oriented in the (100) crystal plane and having the primary flat aligned with the [110] direction. The crystal orientation of the (100) silicon wafer is described in FIG. 7A, while FIG. 7B shows the directions and natural X-axis and Y-axis of the wafer in the <110> directions. For the (100) silicon wafer, the direction of the X-axis is the [110] direction, the direction of the Y-axis is the [−110] direction, and the direction normal to the top surface of the (100) is the [100] direction, which may be regarded as the natural Z-axis of the XYZ coordinate system.

In some embodiments, the interposer 200 having a crystal structure is provided, then the crystallographic orientation of the crystal structure of the interposer 200 is determined. In one embodiment, the interposer 200 may be oriented based on the primary flat of the wafer, and the crystallographic orientations (such as the X-axis and Y-axis) of the crystal structure of the interposer 200 are determined.

In some embodiments, the redistribution structure 210 formed on the substrate 202 includes metallic patterns 206a, 206b, 206c and dielectric layers 208a, 208b, 208c alternately stacked. In some embodiments, the metallic patterns 206a may include conductive parts connected with the through vias 204, and the metallic patterns 206c may include conductive parts functioning as bump pads and/or under bump metallurgies (UBMs). In some embodiments, the material of the dielectric layers 208a, 208b, 208c may comprise polymeric materials, including polyimide (PI), polybenzoxazole (PBO), benzocyclobutene (BCB), or any other suitable polymer-based dielectric material. In some embodiments, the dielectric layers 208a, 208b, 208c may be formed by lamination, coating, chemical vapor deposition (CVD) or the like. In some embodiments, the formation of the metallization patterns 206a, 206b, 206c may include patterning the dielectric layer(s) using photolithography techniques and one or more etching processes and filling a metallic material into the openings of the patterned dielectric layer(s). Any excessive conductive material on the dielectric layer may be removed, such as by using a chemical mechanical polishing process. In some embodiments, the material of the metallization patterns 206a, 206b, 206c includes copper, aluminum, tungsten, silver, titanium and combinations thereof.

In certain embodiments, the interposer 200 may further include active or passive devices, such as transistors, capacitors, resistors, or diodes passive devices formed in the substrate 202.

Figure 2A:
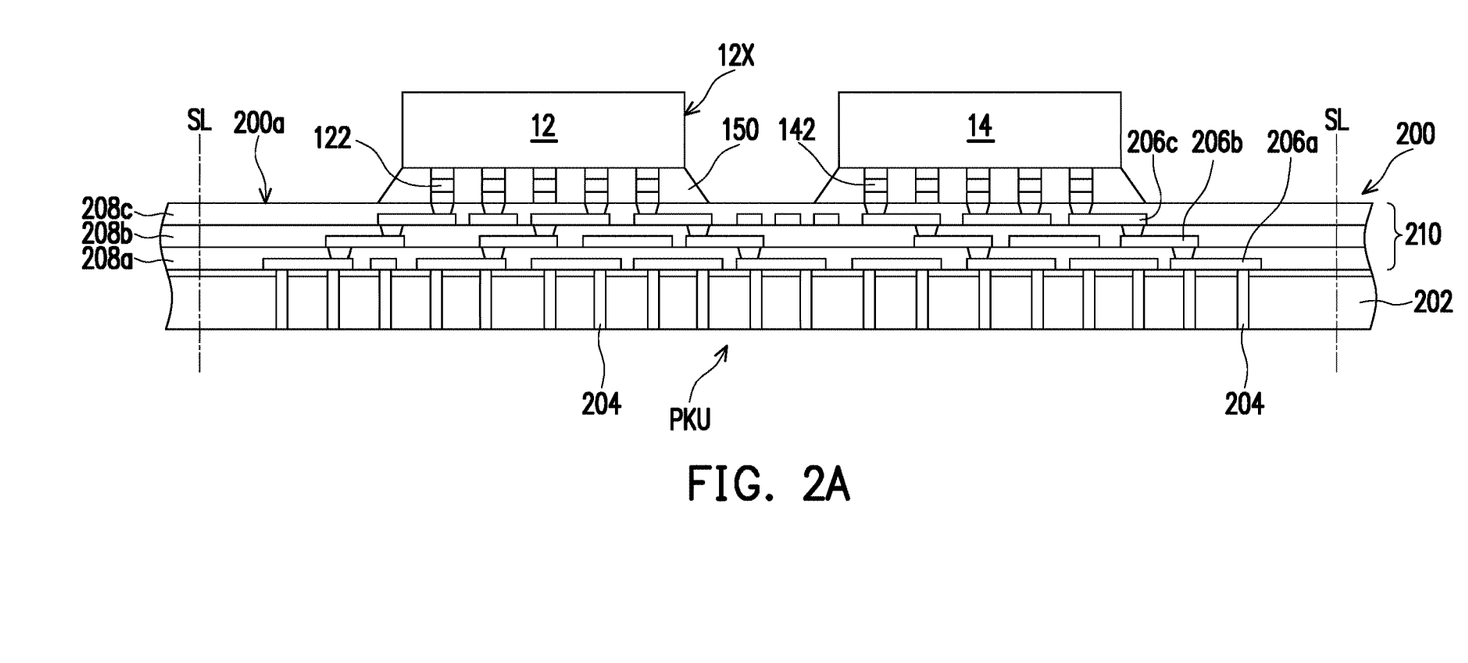
Figure 2B:
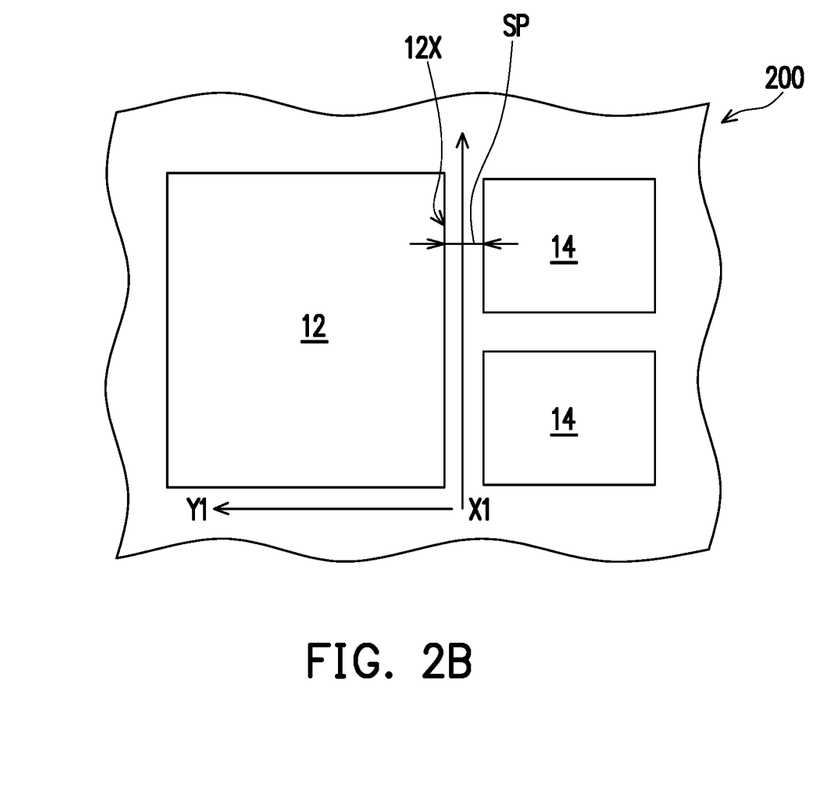
FIG. 2B is a schematic view illustrating the locations of the dies on the interposer in accordance with some embodiments of the present disclosure.

Referring to FIG. 2A and FIG. 2B, first dies 12 and second dies 14 are provided and mounted on the interposer 200. Only one first die and one second die are shown in the figures as exemplary examples, but the numbers of the first die(s) and second die(s) are not limited to the examples shown herein. In some embodiments, the first and second dies 12, 14 are individual semiconductor dies singulated from a wafer. In some embodiments, the first dies 12 contain the same circuitry, such as devices and metallization patterns, or the first dies 12 are the same type of dies. In some embodiments, the second dies 14 contain the same circuitry, or the second dies 14 are the same type of dies. In certain embodiments, the first die 12 and the second die 14 have different circuitry or are different types of dies. In alternative embodiments, the first die 12 and the second die 14 may have the same circuitry.

Viewing from packaging units PKU defined between the scribe lanes (SL), the first die(s) 12 and the second die(s) 14 are arranged on the top surface 200a of the interposer 200 within the span of the packaging units PKU, and the first die(s) 12 and the second die(s) 14 are arranged side-by-side and spaced apart from each other. The layout design of the dies or the positional design for the arrangement of the dies aims to orient the dies in a specific way relative to the crystallographic orientation(s) of the underlying interposer.

In some embodiments, as shown in FIG. 2B, the first die(s) 12 are rectangular shaped dies having two opposite sides 12X and the other two opposite sides connecting the two opposite sides 12X. Also, the second die(s) 14 may be rectangular shaped dies. In one embodiment, two second dies 14 are arranged beside one first die 12 per one packaging unit PKU. In one embodiment, each second die 14 is spaced apart from the first die 12 with a gap of a spacing SP. In one embodiment, the spacing SP may range from 40 microns to 100 microns. Referring to FIG. 2B, when the first die 12 is placed on the interposer 200, the position of the first die 12 is well chosen so as to align the one side 12X of the first die 12 with the direction X1 (to be substantially parallel (within manufacturing deviation) with the direction X1), and then the second dies 14 are oriented to align the sides of the second dies 14 to be substantially parallel (within manufacturing deviation) with the side 12X of the first die 12 and substantially parallel (within manufacturing deviation) with the direction X1. From FIG. 2B, the second dies 14 are arranged in substantially parallel (within manufacturing deviation) and aside the side 12X of the first die 12. As the two second dies 14 are arranged to be spaced apart from the first die 12 with the gap (e.g. with the same spacing SP) and along the direction X1, the direction X1 is also the gap extending direction. That is, the second die 14 is positioned so as to align the side of the second die 14 in substantially parallel (within manufacturing deviation) with the side 12X of the first die 12, and through the arrangement of the facing sides of the first and second dies 12, 14, the extending direction X1 of the gap (the gap extending direction X1) is defined as the direction parallel to the facing sides of the first and second dies 12, 14. In certain embodiments, the gap or spacing SP between the first die 12 and the second die 14 is the shortest distance between the two facing sides of the first and second dies 12, 14, and the gap extending direction X1 is substantially perpendicular to the direction of the spacing SP. The gap existing between the dies is the most stressed location when warpage occurs in the package structure and the stress may be transferred along the lengthwise extending direction of the gap. In one embodiment, the interposer 200 includes a silicon (100) wafer having the crystallographic orientations (e.g. the X, Y, Z axis) as shown in FIGS. 7A-7B, and the first die 12 and the second dies 14 are arranged in such a way that the extending direction X1 of the gap is not parallel with the natural axis X of the interposer 200. Through the mismatch of the stressed location(s) and the crystal lattice orientation of the underlying wafer interposer, the stress transferring direction is not parallel with the crystal lattice orientation, so as to avoid stress from being transferred to the interposer to cause cracking. That is, there is an angle θ between the gap extending direction X1 (defined by the facing sides of the first and second dies) and the crystallographic orientation X of the interposer 200 (i.e. the natural axis X of the wafer of the interposer 200), and the angle θ is larger than zero and smaller than 180 degrees. In some embodiments, the angle θ ranges from about 60 degrees to about 120 degrees. In some embodiments, the angle θ ranges from 75 degrees to about 105 degrees. In some embodiments, the angle θ ranges from 85 degrees to about 95 degrees. In one embodiment, the angle θ is about 90 degrees, the direction X1 is in the [−1-10] direction. When the angle θ is about 90 degrees, minimal stress is transferred and better stress resistant effect is achieved.

In certain embodiments, the first die 12 has a surface area larger than that of the second die 14. Also, in some embodiments, the first die 12 and the second die 14 may be of different sizes, including different surface areas and/or different thicknesses. In some embodiments, the first die 12 may be a logic die, including a central processing unit (CPU) die, a graphics processing unit (GPU) die, a system-on-a-chip (SoC) die, a microcontroller or the like. In some embodiments, the first die 12 is a power management die, such as a power management integrated circuit (PMIC) die. In some embodiments, the second die 14 may be a memory die, including a dynamic random access memory (DRAM) die, a static random access memory (SRAM) die or a high bandwidth memory (HBM) die. In some embodiments, the first die 12 includes connecting elements 122 formed on the active surface of the body of the first die 12. In certain embodiments, the connecting elements 122 may further include pillar structures. In some embodiments, the second die 14 include connecting elements 142 formed on the active surface of the second die 14. In other embodiments, the connecting elements 142 may further include pillar structures. In some embodiments, the active dies are stacks of one or more dies (e.g. logic die stacks or memory die stacks). In these embodiments, the material(s), the amount, and/or the size may be not limited to the descriptions provided in the embodiments.

In FIGS. 2A-2B, the first dies 12 and the second dies 14 are attached to the top surface 200a of the interposer 200, for example, through the connecting elements 122, 144 by way of flip-chip bonding. In certain embodiments, through performing a reflow process, the connecting elements 122, 142 are bonded to certain conductive parts of the metallic patterns 206c, electrically and physically connecting the dies 12, 14 with the interposer 200. In certain embodiments, the connecting elements 122, 142 may be micro-bumps, such as micro-bumps having copper metal pillars. The connecting elements 122, 142 electrically connect the first dies 12 and the second dies 14, through the metallic patterns 206a, 206b, 206c, with the through vias 204 of the interposer 200.

In some embodiments, the reflow process is performed as part of the bonding process to bond the first dies 12 and second dies 14 onto the redistribution structure 210 and to the interposer 200. In one embodiment, the connecting elements 122, 142 are micro bumps, and the reflow temperature ranges from 210 Celsius degrees to 250 Celsius degrees, or at about 240 Celsius degrees.

In some embodiments, through the arrangement of the first and second dies in a specific way, so that the gap extending direction between the first and second dies is not parallel to the crystallographic orientation(s) of the semiconductor wafer of the interposer, the strength of the interposer is improved. By doing so, the interposer strength is strengthened, especially at the gaps between the various dies where warpage easily occurs during the high temperature thermal process (such as the reflow process), and possible cracking of the interposer due to the warpage may be significantly reduced or minimized.

In some embodiments, the bonding between the dies 12, 14 and the interposer 200 may be solder bonding. In some embodiments, the bonding between the dies 12, 14 and the interposer 200 may be direct metal-to-metal bonding, such as copper-to-copper bonding. In some embodiments, an underfill material 150 may be dispensed between the gaps between the dies 12, 14 and the interposer 200 and surrounding the connecting elements 122, 142 of the dies 12, 14.

Figure 3:
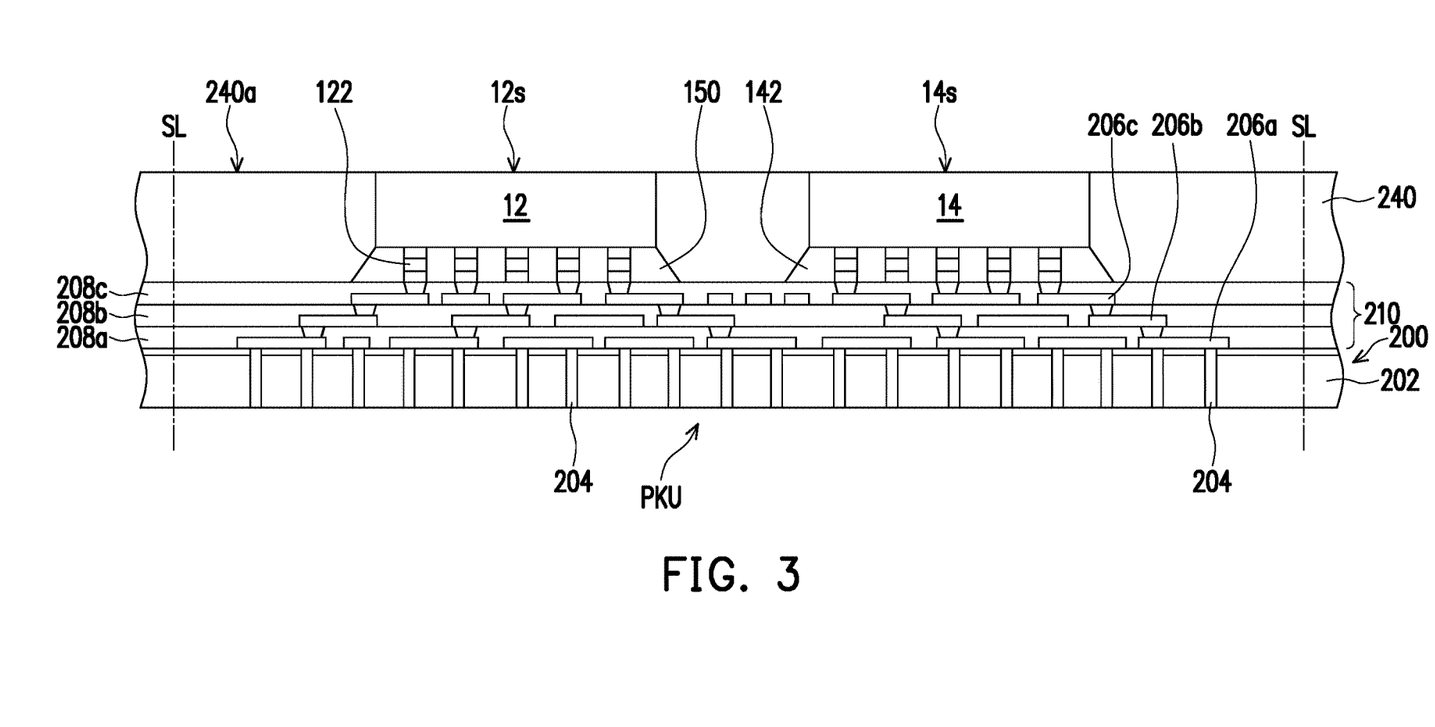

In FIG. 3, an encapsulant 240 is formed over the interposer 200 covering the first and second dies 12, 14, the underfill material 150 and the connecting elements 122, 142. In some embodiments, the encapsulant 240 may be a molding compound. In some embodiments, the encapsulant 240 includes epoxy resin(s) and may be formed by over-molding, compression molding or transfer molding. In one embodiment, a curing process may be performed to cure the encapsulant 240. In some embodiments, the first and second dies 12, 14 and the connecting elements 122, 142 are encapsulated by the encapsulant 240. In some embodiments, a planarization process, including grinding or polishing, may be performed to partially remove the encapsulant 240, exposing backside surfaces 12S, 14S of the first and second dies 12, 14. In certain embodiments, the backside surfaces 12S, 14S of the first and second dies 12, 14 are levelled with a top surface 240a of the encapsulant 240.

Figure 4:
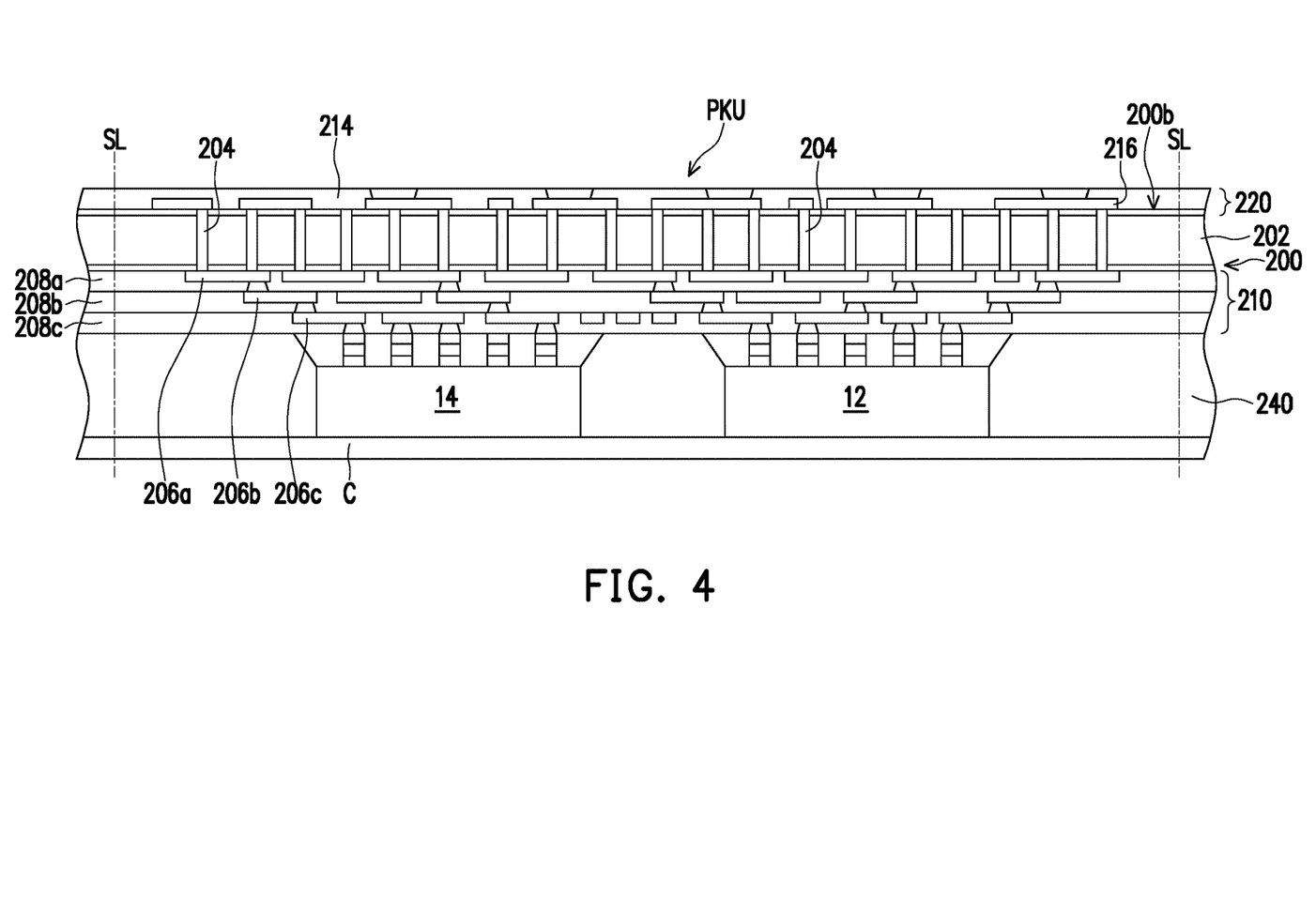

In FIG. 4, the structure of FIG. 3 is flipped or turned upside down, and placed on a carrier C, so that the carrier C directly contacts the backside surfaces 12S, 14S of the first and second dies 12, 14 and the top surface 240a of the encapsulant 240.

In FIG. 4, a redistribution structure 220 is formed on the other surface 202b of the interposer 200. In some embodiments, the redistribution structure 220 electrically connects the through vias 204 and the redistribution structures 210 and 220 are electrically connected through the through vias 204. In certain embodiments, the redistribution structure 220 includes at least one dielectric layer 214 and metallization patterns 216 in the dielectric layer 214. In some embodiments, the metallization patterns 216 may comprise pads, vias and/or trace lines to interconnect the through vias 204 and to further connect the through vias 204 to one or more conductive elements and/or external devices. Although one layer of dielectric layer is shown in FIG. 4, it is understood that more than one dielectric layer may be included within the redistribution structure. In some embodiments, the material of the dielectric layer 214 may comprise polymeric materials, including polyimide (PI), polybenzoxazole (PBO), benzocyclobutene (BCB), or any other suitable polymer-based dielectric material. In some embodiments, the dielectric layer 214 may be formed by lamination, coating, CVD or the like. In some embodiments, the formation of the metallization patterns 216 may include patterning the dielectric layer using photolithography techniques and one or more etching processes and filling a metallic material into the openings, and polishing the excessive conductive material on the dielectric layer by using a chemical mechanical polishing process. In some embodiments, the material of the metallization patterns 216 includes copper, aluminum, tungsten, silver, titanium and combinations thereof.

Figure 5:
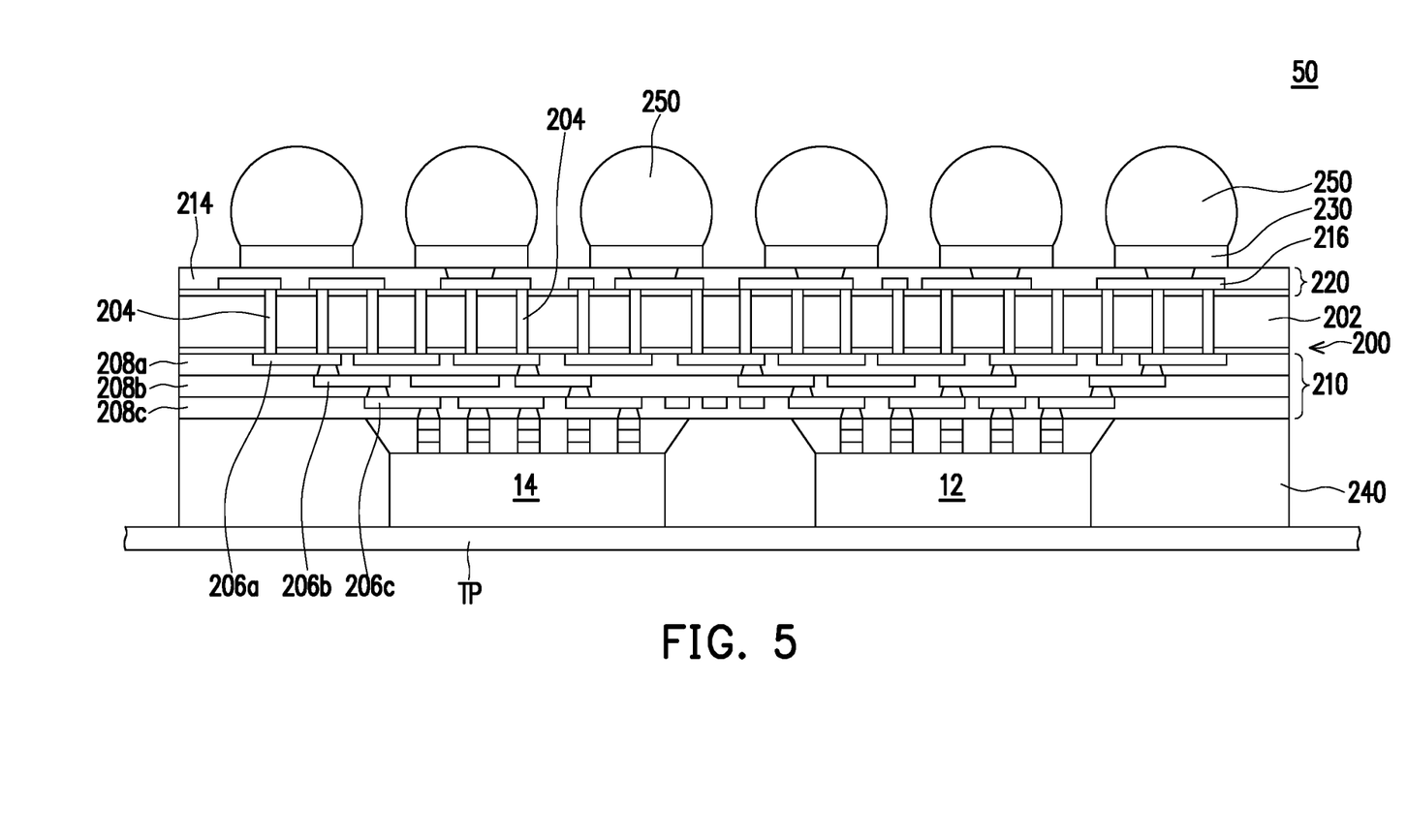

In FIG. 5, conductive connectors 250 are formed on the metallization patterns 216 of the redistribution structure 220. In some embodiments, under-metal bumps 230 are formed on the metallization patterns 216 and the conductive connectors 250 are formed on the under-bump pads 230. In some embodiments, the under-metal bumps 230 include under-metal metallurgies (UBMs). The conductive connectors 250 are electrically coupled to the through vias 204 through the metallization patterns 216 of the redistribution structure 220. In some embodiments, the conductive connectors 250 are located on the top surface 220a of the redistribution structure 220. In some embodiments, the conductive connectors 250 include lead-free solder balls, solder balls, ball grid array (BGA) balls, gold bumps, controlled collapse chip connection (C4) bumps or micro bumps containing copper pillars. In some embodiments, the conductive connectors 250 may include a conductive material such as solder, copper, aluminum, gold, nickel, silver, palladium, tin, or a combination thereof. In some embodiments, the conductive connectors 250 are formed by forming the solder paste on the redistribution structure 300 by, for example, evaporation, electroplating, printing or solder transfer and then reflowed into the desired bump shapes. In some embodiments, the conductive connectors 250 are placed on the redistribution structure 300 by ball placement or the like. In other embodiments, the conductive connectors 250 are formed by forming solder-free metal pillars (such as a copper pillar) by sputtering, printing, electroless or electro plating or CVD, and then forming a lead-free cap layer by plating on the metal pillars.

The conductive connectors 250 may be used to bond to an external device or an additional electrical component. In some embodiments, the conductive connectors 250 are used to bond to a circuit substrate, a semiconductor substrate or a packaging substrate.

In FIG. 5, after the formation of the conductive connectors 250, a singulation process is performed to cut the wafer form structure along the scribe lanes SL (FIG. 4) around the package units PKU into a plurality of individual packages 50. In some embodiments, as shown in FIG. 5, each package 50 includes at least one first die 12, more than one second dies 14, encapsulant 240 surrounding the first and second dies 12, 14, connecting elements 122, 142, part of the interposer 200 (including through vias 204), the redistribution structures 210, 220 including the metallic patterns and the metallization patterns 216 (the cut redistribution structure referred also as the redistribution structure in FIG. 5) and conductive connectors 250 disposed on the top surface 220a of the redistribution structure 220. In some embodiments, the singulation process may include a blade sawing process or a wafer dicing process.

After the singulation process, the packages 50 may be detached from the carrier C and transferred to a tape film TP. In the subsequent process(es), the packages 70 may be flipped and further mounted on a circuit substrate or a packaging substrate.

Figure 6:
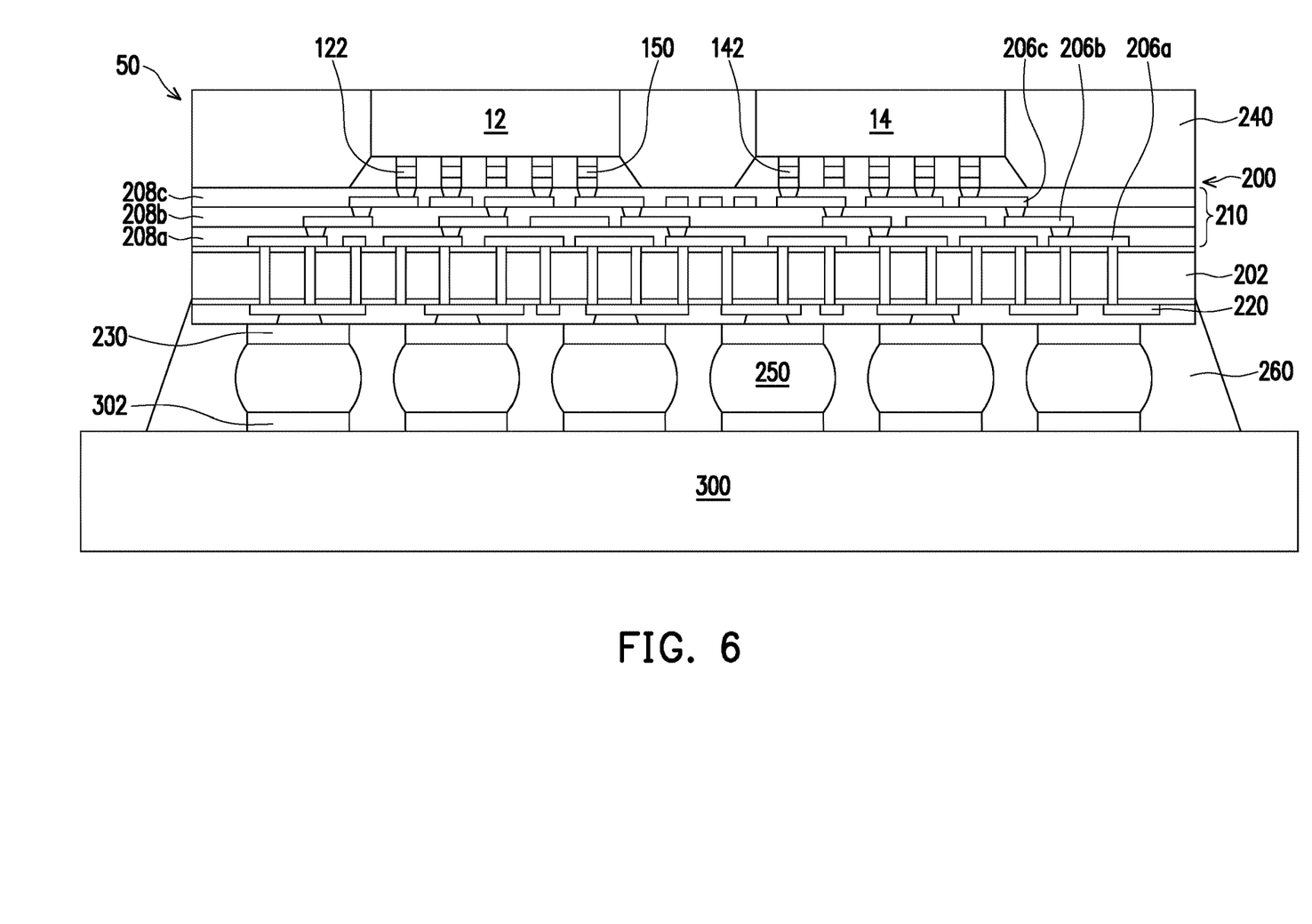

In FIG. 6, a circuit substrate 300 having mounting portions 302 thereon is provided. In some embodiments the circuit substrate 300 may include a build-up substrate, a laminate substrate, a circuit board such as a printed circuit board (PCB), or the like. In some embodiments, the mounting portion 302 may include pre-solder formed on pads of the circuit substrate. In addition, the circuit substrate 300 may further comprise electrical contacts or other electric components embedded therein.

In FIG. 6, the package 50 is placed on the circuit substrate 300 and the package 50 is bonded to the circuit substrate 300 by performing a reflow process. In some embodiments, the package 50 is picked and placed over a top surface of the circuit substrate 300 and the conductive connectors 250 on the bottom surface of the package 50 are aligned to and disposed on the mounting portions 302 of the circuit substrate 300. The reflow process is performed as part of the bonding process to the package 50 and the circuit substrate 300 for bonding the conductive connectors 250 to the mounting portions 302. In some embodiments, the reflow process includes performing a thermal process to turn the conductive connectors 250 into a melted state or a semi-melted state to integrate and bond with the mounting portions 302 of the circuit substrate 300. The reflow temperature of the conductive connectors 250 is required to be higher than a melting point of the conductive connectors 250. In one embodiment, the conductive connectors 250 are C4 bumps, and the reflow temperature ranges from 210 degrees Celsius to 250 degrees Celsius. In one embodiment, the conductive connectors 250 are solder balls or lead-free solder balls, and the reflow temperature ranges from 200 degrees Celsius to 260 degrees Celsius.

In some embodiments, the package 50 has the first die 12 and the second dies 14 around the first die 12 bonded on the interposer 200. As shown in FIG. 2A and FIG. 2B, through the arrangement of the first and second dies 12, 14 in a specific way to ensure that the gap extending direction X1 between the first and second dies 12, 14 is not parallel with the crystallographic orientation(s) of the semiconductor wafer of the interposer, the strength of the interposer structure is improved. Under the thermal impact during the reflow process, even owing to the CTE mismatch, the package 50 (and the dies 12, 14) may become less warped as the interposer strength is improved, and less or no cracking may occur for the interposer structure.

Through adjusting the arrangement or alignment of the semiconductor dies on the semiconductor interposer, the structural strength of the package structure is improved. As the gap extending direction defined by the spaced apart dies is pre-arranged not to be parallel with the crystallographic orientation of the crystal structure of the interposer, the strength of the crystalline interposer is improved by 20% when compared with the arrangement of dies having the gap extending direction parallel with the crystallographic orientation of the underneath interposer. Hence, the issues of interposer cracking during reflowing may be significantly reduced. Accordingly, the reliability of the package is greatly enhanced and the production yield is much increased.

Figure 8A:
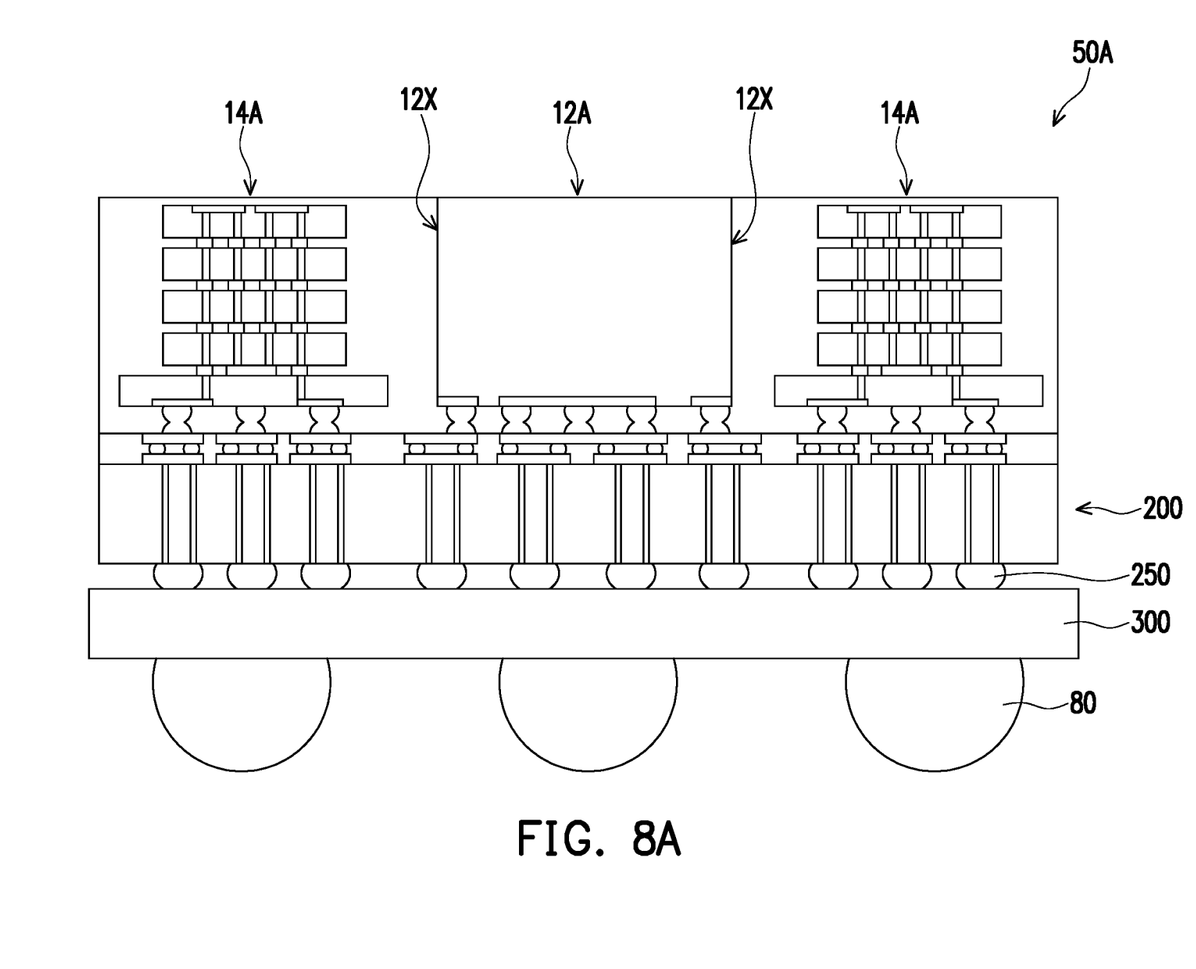
FIG. 8A is a schematic cross-sectional view illustrating a package and a circuit substrate in accordance with an embodiment of the present disclosure.
Figure 8B:
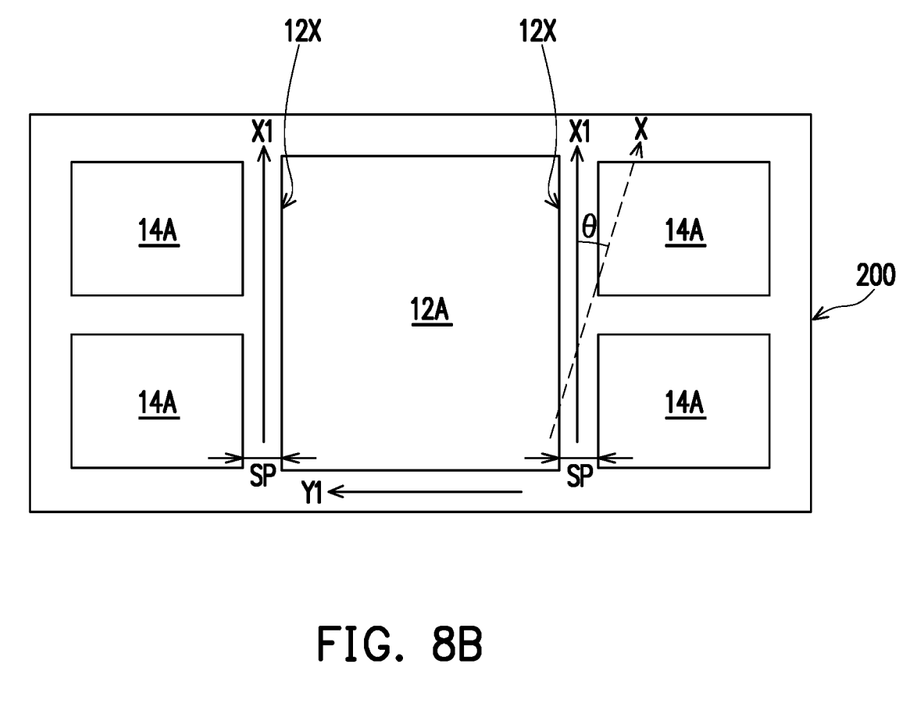
FIG. 8B is a schematic view illustrating the locations of the dies on the interposer in accordance with the embodiment of the present disclosure.

FIG. 8A is a schematic cross-sectional view illustrating a package and a circuit substrate in accordance with an embodiment of the present disclosure. FIG. 8B is a schematic top view illustrating the arrangement of the dies on the interposer in the package in accordance with an embodiment of the present disclosure.

In FIG. 8A, the package 50A is bonded on the circuit substrate 300 through conductive connectors 250. In some embodiments, the package 50A is a CoWoS package having a first die 12A larger in size and several second dies 14A arranged around the first die 12A, and the circuit substrate 300 further includes conductive balls 80 for external connection. In such embodiment, four second dies 14A are arranged beside and around one first die 12A in the package 50A, and two groups of two second dies 14A are arranged in parallel and respectively arranged aside both opposite sides 12X of the first die 12A as shown in FIG. 8B. In some embodiments, the first die 12A may be a logic die, including a central processing unit (CPU) die, a graphics processing unit (GPU) die, a system-on-a-chip (SoC) die, a microcontroller or the like. In some embodiments, the first die 12A is a power management die, such as a power management integrated circuit (PMIC) die. In some embodiments, the second die 14A may be a memory die, including a dynamic random access memory (DRAM) die, a static random access memory (SRAM) die or a high bandwidth memory (HBM) die.

In one embodiment, the second dies 14A are spaced apart from the first die 12A with a gap or a spacing SP, and there is a gap extending direction X1 defined by the facing sides of the first die 12A and the second dies 14A. In one embodiment, the interposer 200 may have a crystal structure having the crystallographic orientation X, as shown in FIG. 8B, and there is an angle θ between the gap extending direction X1 (defined by the facing sides of the first and second dies) and the crystallographic orientation X of the interposer 200, and the angle θ is larger than zero and smaller than 180 degrees. In some embodiments, the angle θ ranges from about 60 degrees to about 120 degrees. In some embodiments, the angle θ ranges from 75 degrees to about 105 degrees. In some embodiments, the angle θ ranges from 85 degrees to about 95 degrees. In one embodiment, the angle θ is about 90 degrees.

In the embodiments, through the displacement of the dies, the gaps between the dies are designed to have an extending direction not parallel with the crystallographic orientation of the underneath crystal structure of the interposer. In certain embodiments, the strength of the interposer of the package is improved and the structural reliability of the package is enhanced.

In accordance with some embodiments of the disclosure, a manufacturing process is provided. An interposer having a crystal structure is provided. After disposing a first die on the interposer, a second die is disposed on the interposer. The second die is positioned to be spaced apart from the first die with a gap and to define a gap extending direction of the gap. The gap extending direction is not parallel with a crystallographic orientation of the crystal structure of the interposer. The first and second dies are bonded to the interposer. A molding compound is formed over the interposer covering the first and second dies. The molding compound and the interposer are cut into packages.

In accordance with some alternative embodiments of the disclosure, a packaging process includes the following steps. A wafer interposer having a crystal structure is provided and a crystallographic orientation of the crystal structure is determined. First dies are disposed on the wafer interposer and one side of each first die is oriented to be parallel with a first direction. The first direction is oriented with an angle θ between the crystallographic orientation and the first direction, and the angle θ is larger than zero and smaller than 90 degrees. Second dies are disposed on the wafer interposer and one side of each second die is oriented to be parallel to the first direction. The second dies are disposed aside the first dies and spaced apart from the first dies with gaps, and the gaps are extended in the first direction. The first and second dies ae bonded to the wafer interposer. A molding compound is formed over the wafer interposer covering the first and second dies. The molding compound and the wafer interposer are diced into packages.

In accordance with some embodiments of the disclosure, a package structure is described. The package structure includes a semiconductor interposer, first and second dies, and conductive connectors. The semiconductor interposer has a crystal structure, and has a first surface and a second surface opposite to the first surface. The semiconductor interposer includes through vias (204) extending from the first surface to the second surface. The first die is disposed on the first surface of the semiconductor interposer and electrically connected with the through vias. The second dies are disposed on the first surface of the semiconductor interposer, disposed aside the first die and electrically connected with the through vias. The first die is separated from the second dies with a gap in-between, and facing sides of the first die and the second dies define a gap extending direction of the gap. The gap extending direction is not parallel with a crystallographic orientation of the crystal structure of the semiconductor interposer. The conductive connectors are disposed on the second surface of the semiconductor interposer and electrically connected with the through vias.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A manufacturing process, comprising:
providing an interposer having a crystal structure;
disposing a first die and a second die on the interposer, wherein the second die is located beside the first die and spaced apart from the first die with a gap, the first and second dies are positioned to define a stress transferring direction that is perpendicular to a shortest distance of the gap, and the stress transferring direction is perpendicular to a <110> crystallographic orientation of the crystal structure of the interposer;
connecting the first and second dies to the interposer; and
forming a molding compound over the interposer to cover the first and second dies.

2. The process according to claim 1, wherein connecting the first and second dies to the interposer includes performing a reflow process to bond the first and second dies to the interposer through micro bumps.

3. The process according to claim 1, wherein the interposer is provided with a semiconductor substrate and through semiconductor vias in the interposer.

4. The process according to claim 1, further comprising performing a singulation process to cut through the molding compound and the interposer.

5. The process according to claim 4, further comprising forming conductive connectors on the cut interposer after performing the singulation process.

6. The process according to claim 4, further comprising forming a redistribution structure on the interposer before forming the conductive connectors.

7. The process according to claim 1, wherein the first die comprises at least one logic die, and the second die comprises at least one memory die.

8. The process according to claim 1, further comprising forming a redistribution structure on the interposer before disposing the first die and the second die.

9. A packaging process, comprising:
providing a wafer interposer having a crystal structure;
providing a first die and a second die;
mounting and positioning the first die and the second die on the wafer interposer, wherein the first and second dies are positioned side by side on the wafer interposer and are spaced apart from each other with a gap therebetween, and the first and second dies are oriented to define a stress transferring direction that is perpendicular to a shortest distance of the gap, and the stress transferring direction is perpendicular to a <110> crystallographic orientation of the crystal structure of the wafer interposer;
forming a molding compound over the wafer interposer and covering the first and second dies; and
dicing through the molding compound and the wafer interposer into packages.

10. The process according to claim 9, wherein the wafer interposer includes a silicon wafer having a cubic crystal structure.

11. The process according to claim 9, wherein the wafer interposer is provided with a semiconductor substrate and through semiconductor vias.

12. The process according to claim 11, further comprising forming conductive connectors electrically connected to the semiconductor vias.

13. The process according to claim 12, further comprising providing a circuit substrate and bonding the conductive connectors of the package to the circuit substrate by performing a reflow process.

14. The process according to claim 12, further comprising forming a redistribution structure on the wafer interposer before forming the conductive connectors.

15. A package structure, comprising:
a semiconductor interposer having a crystal structure, where the semiconductor interposer has a first surface and a second surface opposite to the first surface;
a first die and a second die disposed on the first surface of the semiconductor interposer, wherein the second die is located beside the first die, the second die is spaced apart from the first die with a gap, the first and second dies are positioned to define a stress transferring direction that is perpendicular to a shortest distance of the gap, and the stress transferring direction is perpendicular to a <110> crystallographic orientation of the crystal structure of the semiconductor interposer; and
conductive connectors, disposed on the second surface of the semiconductor interposer and electrically connected with the first and second dies through the semiconductor interposer.

16. The structure according to claim 15, wherein the semiconductor interposer includes through vias extending from the first surface to the second surface, and the first and second dies are electrically connected with the through vias.

17. The structure according to claim 16, further comprising a redistribution structure disposed on the first surface of the semiconductor interposer, and the first and second dies are electrically connected with the through vias through the redistribution structure.

18. The structure according to claim 16, further comprising a redistribution structure disposed on the second surface of the semiconductor interposer, and the conductive connectors are electrically connected with the through vias through the redistribution structure.

19. The structure according to claim 15, wherein the first die comprises at least one logic die, and the second die comprises at least one memory die.

20. The process according to claim 15, wherein the first and second dies are of different sizes.

* * * * *